United States Patent
Nomura et al.

(10) Patent No.: US 10,442,149 B2
(45) Date of Patent: Oct. 15, 2019

(54) PRESSING DEVICE

(71) Applicant: THK CO., LTD., Tokyo (JP)

(72) Inventors: Yuki Nomura, Tokyo (JP); Takeo Karaushi, Tokyo (JP); Hideya Nakayama, Tokyo (JP)

(73) Assignee: THK CO., LTD., Tokyo (JP)

( * ) Notice: Subject to any disclaimer, the term of this patent is extended or adjusted under 35 U.S.C. 154(b) by 0 days.

(21) Appl. No.: 15/554,331

(22) PCT Filed: Feb. 29, 2016

(86) PCT No.: PCT/JP2016/056040
§ 371 (c)(1),
(2) Date: Aug. 29, 2017

(87) PCT Pub. No.: WO2016/140184
PCT Pub. Date: Sep. 9, 2016

(65) Prior Publication Data
US 2018/0036985 A1    Feb. 8, 2018

(30) Foreign Application Priority Data
Mar. 2, 2015 (JP) .................... 2015-039851

(51) Int. Cl.
*B30B 15/14* (2006.01)
*H02K 11/21* (2016.01)
(Continued)

(52) U.S. Cl.
CPC ............ *B30B 15/148* (2013.01); *B30B 15/14* (2013.01); *H02K 11/21* (2016.01); *H02K 11/33* (2016.01);
(Continued)

(58) Field of Classification Search
CPC ......... B30B 1/42; B30B 15/148; B30B 15/26; B30B 15/166; B30B 15/14;
(Continued)

(56) References Cited

U.S. PATENT DOCUMENTS 5,071,603 A * 12/1991 Kurumaji ................ B30B 15/20
264/328.7
5,285,946 A *  2/1994 Tomigashi ......... H05K 13/0409
228/9

(Continued)

FOREIGN PATENT DOCUMENTS

CN    101911466 A   12/2010
CN    102019714 A    4/2011
(Continued)

OTHER PUBLICATIONS

Machine Translation of JP2013-115142, Translated Feb. 5, 2018, 14 Pages.*

(Continued)

*Primary Examiner* — Gregory D Swiatocha
(74) *Attorney, Agent, or Firm* — Westerman, Hattori, Daniels & Adrian, LLP (57) ABSTRACT

This pressing device includes an actuator, a pressing unit provided on a movable element of the actuator, a movement quantity detector for detecting a movement quantity of the movable element and outputting movement quantity information indicating the movement quantity, and a drive device that moves the pressing unit to press a pressed object by supplying a drive current to the actuator based on the movement quantity information. The drive device controls an operation of the pressing unit using position control processing based on current information indicating the drive current and the movement quantity information. When the speed of the pressing unit is decelerated down to a predetermined lower limit speed, the drive device controls the (Continued)

speed of the pressing unit to be constant based on the current information, and when the current reaches a predetermined current value, determines that the pressing operation is performed.

3 Claims, 8 Drawing Sheets

(51) Int. Cl.
  *H02K 11/33* (2016.01)
  *H02P 25/06* (2016.01)
  *H05K 13/04* (2006.01)
  *H02K 41/035* (2006.01)
(52) U.S. Cl.
  CPC ......... *H02K 41/0356* (2013.01); *H02P 25/06* (2013.01); *H05K 13/0409* (2018.08); *H05K 13/0413* (2013.01)
(58) Field of Classification Search
  CPC ........... H05K 13/0408; H05K 13/0409; H05K 13/0404; H05K 13/0413; H05K 13/046; H05K 41/0356; H02P 25/06; H02K 11/21; H02K 11/33
  See application file for complete search history.

(56) References Cited

U.S. PATENT DOCUMENTS

| | | | | |
|---|---|---|---|---|
| 5,587,633 A * | 12/1996 | Aoki | ...................... | B30B 1/181 318/162 |
| 6,298,547 B1 * | 10/2001 | Okuda | ............... | H05K 13/0409 29/740 |
| 6,513,233 B1 | 2/2003 | Nakao et al. | | |
| 6,828,747 B2 * | 12/2004 | Endo | .................... | G05B 19/416 318/268 |
| 2002/0053133 A1 * | 5/2002 | Suhara | ............... | H05K 13/0408 29/700 |
| 2002/0167801 A1 * | 11/2002 | Suhara | ............... | H05K 13/0413 361/728 |
| 2012/0123564 A1 * | 5/2012 | Yajima | ................... | G05B 19/19 700/33 |
| 2015/0223374 A1 * | 8/2015 | Nozawa | ............. | H05K 13/0417 29/739 |

FOREIGN PATENT DOCUMENTS

| | | | |
|---|---|---|---|
| CN | 102467101 A | | 5/2012 |
| DE | 19606842 A1 | | 8/1996 |
| JP | 2828406 B2 | | 11/1998 |
| JP | 2000-133995 A | | 5/2000 |
| JP | 2002-33597 A | | 1/2002 |
| JP | 2007-95753 A | | 4/2007 |
| JP | 2013-115142 A | | 6/2013 |
| JP | 2013115142 A | * | 6/2013 |
| TW | 201324242 A1 | | 6/2013 |
| TW | I426416 B | | 2/2014 |

OTHER PUBLICATIONS

International Search Report dated May 24, 2016, issued in counterpart application No. PCT/JP2016/056040, w/English translation. (4 pages).
Office Action dated Mar. 15, 2018, issued in counterpart Chinese Application No. 201680012744.2, with partial English translation. (7 pages).
Office Action dated Jan. 25, 2018, issued in counterpart German Application No. 11 2016 001 005.2, with English translation (8 pages).
Office Action dated Mar. 27, 2019, issued in counterpart TW Application No. 105106199, with English translation. (12 pages).

* cited by examiner

PRESSING DEVICE

TECHNICAL FIELD

The present invention relates to a pressing device.

The present application claims priority based on Japanese Patent Application No. 2015-039851 filed on Mar. 2, 2015, the contents of which are incorporated herein by reference

BACKGROUND Art

Patent Document 1 described below discloses an automatic pressing method for reducing impact force when a moving target object collides with a contact target object, and for reducing a time required for obtaining force necessary for pressing.

This automatic pressing method is a method in which the moving target object is moved by a motor, and the moving target object is pressed to the contact target object. In this automatic pressing method, the moving target object is pressed to the contact target object by controlling the motor as described below. First, when the movement of the moving target object starts, the moving target object is accelerated at a maximum acceleration. Thereafter, a speed of the moving target object is decelerated to be equal to or lower than an allowable value at a maximum deceleration until the moving target object collides with the contact target object. When the speed of the moving target object becomes equal to or lower than the allowable value, the speed is accelerated again. Thereafter, the moving target object is pressed to the contact target object by controlling the motor so as to generate a predetermined torque by decelerating again.

RELATED ART DOCUMENT

Patent Document

Patent Document 1: Japanese Patent No. 2828406

SUMMARY

Problems to be Solved by the Invention

In the related art described above, by decelerating the moving target object (a pressing unit) after the acceleration at the maximum acceleration, and by decelerating again after the accelerating again when the speed of the moving target object is equal to or lower than the allowable value, it is possible to reduce a time (a tact time) from the time when the pressing unit starts to move to the time when the pressing unit stops. However, since the speed is accelerated again and decelerated immediately before the contact target object (a pressed object), the pressing unit cannot be sufficiently decelerated, and thus, there is a possibility that the impact force cannot be suppressed when the pressing unit collides with the pressed object.

The present invention provides a pressing device that can reduce the tact time and suppress the impact force to the pressed object by the pressing unit.

Means for Solving the Problem

According to a first aspect of the present invention, a pressing device includes an actuator, a pressing unit provided on a movable element of the actuator, a movement quantity detector for detecting a movement quantity of the movable element and outputting movement quantity information indicating the movement quantity, and a drive device that moves the pressing unit to press a pressed object by supplying a drive current to the actuator based on the movement quantity information. The drive device is configured to store a position where the pressing unit is in contact with the pressed object as a target position in advance. When the pressing unit starts to move, the drive device is configured to accelerate the pressing unit up to a maximum speed at a maximum acceleration using position control processing based on current information indicating the drive current and the movement quantity information. The drive device is configured to maintain the maximum speed when the speed of the pressing unit reaches the maximum speed. The drive device is configured to decelerate the pressing unit at a maximum deceleration when the pressing unit reaches a deceleration start position where the speed of the pressing unit becomes zero at the target position in a case where the pressing unit is decelerated at the maximum deceleration. The drive device is configured to switch the processing from the position control processing to thrust control processing based on the current information when the speed of the pressing unit is decelerated down to a predetermined lower limit speed, and is configured to control the speed of the pressing unit to be constant based on the current information. When the current reaches a predetermined current value, the drive device is configured to determine that the pressing operation is performed.

According to a second aspect of the present invention, the drive device may calculate a position of the movable element based on the movement quantity information at a time point when the drive current supplied to the actuator becomes equal to or greater than a predetermined threshold value when moving the pressing unit toward the pressed object at a constant speed, and may store the position as the target position.

According to a third aspect of the present invention, the drive device may calculate a temporary target position by adding a predetermined distance to the target position, and may calculate the deceleration start position based on the temporary target position.

According to a fourth aspect of the present invention, the drive device may store the drive current at that time as a reference current when the pressing unit stops, may calculate a moving mass based on the reference current, may calculate the maximum deceleration based on the moving mass, may calculate a deceleration time required for the speed to be decelerated at the maximum deceleration down to zero from the lower limit speed based on the maximum deceleration, may calculate a temporary target position by adding the target position to a correction distance obtained from the maximum deceleration and the deceleration time, and may calculate the deceleration start position based on the temporary target position.

According to a fifth aspect of the present invention, the actuator may be a linear motor.

According to a sixth aspect of the present invention, the pressing unit may have a gripping function for gripping a predetermined electronic component, and may press and mount the electronic component as a mounted object to a printed substrate which is a mounting target object and the pressed object.

Advantage of the Invention

According to the pressing device described above, it is possible to reduce a tact time and suppress impact force to a pressed object by a pressing unit.

DESCRIPTION OF THE EMBODIMENTS

Hereinafter, the embodiment of the present invention will be described with reference to the drawings.

Figure 1:
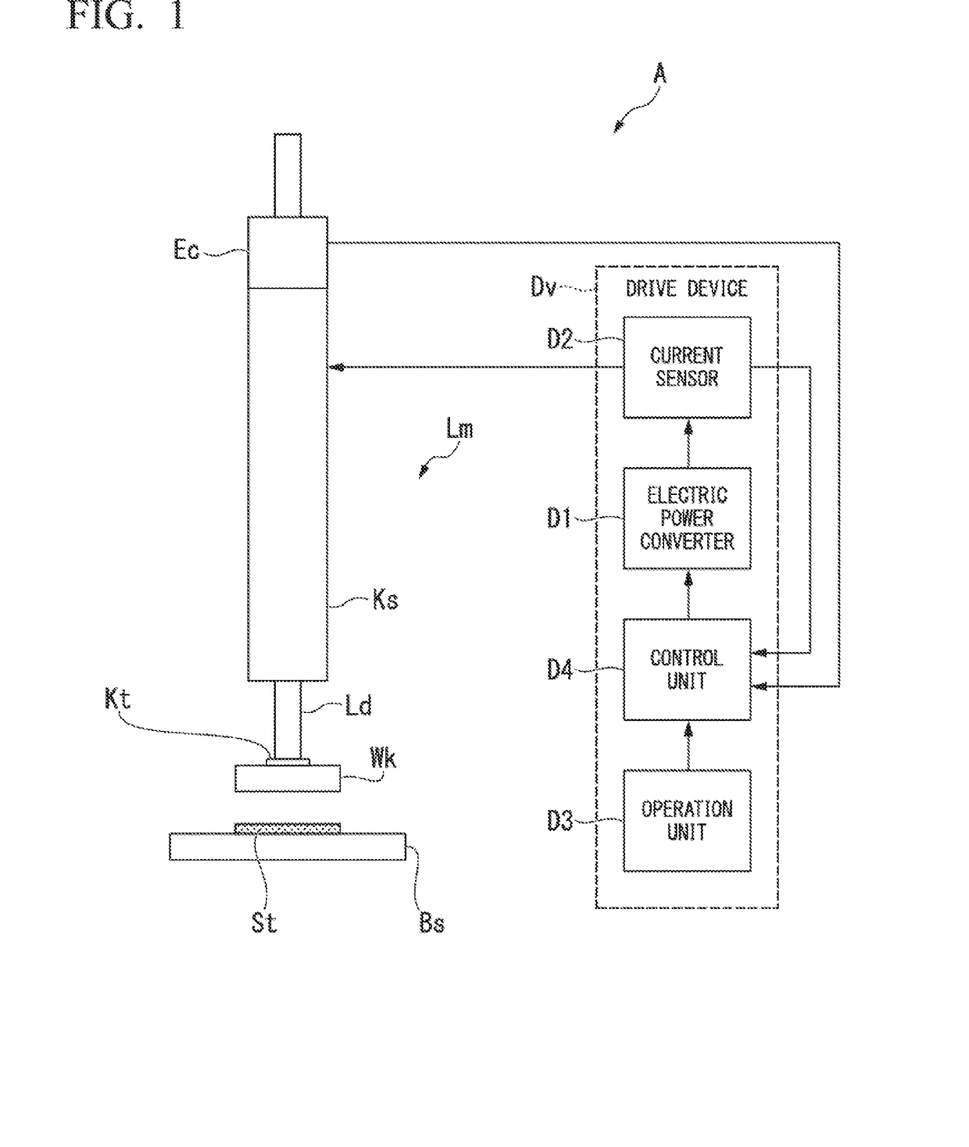
FIG. 1 is a schematic diagram showing a pressing device in an embodiment of the present invention.

As shown in FIG. 1, a pressing device A in the present embodiment includes a linear motor Lm (actuator), an encoder Ec (movement quantity detector), adsorption unit Kt (a pressing unit) and a drive device Dv. The pressing device A moves an adsorption unit Kt mounted on a movable element Ld included in the linear motor Lm in the vertical direction, and presses a work Wk such as an electronic component adsorbed (that is, gripped) to the adsorption unit Kt toward a substrate Bs (a pressed object). In this way, the pressing device A can attach the work Wk on a predetermined position on the substrate Bs via adhesive St. The linear motor Lm, the encoder Ec and the drive device Dv configure the pressing device. In addition, the substrate Bs is, for example, a printed substrate.

The linear motor Lm includes a fixed element Ks and the movable element Ld. The linear motor Lm causes the movable element Ld to linearly move in the vertical direction based on an electric driving power input from the drive device Dv. The fixed element Ks has, for example, a shape of substantially quadrangular prism shape. The fixed element Ks is supported by a predetermined structure in a posture of extending in the vertical direction, and a plurality of coils are arrayed inside thereof in the extending direction. The plurality of coils described above are, for example, coils formed of U-shape, V-shape, and W-shape respectively. The electric driving power is supplied to the plurality of coils from the drive device Dv via an electric power line. A bearing for guiding the linear motion of the movable element Ld is provided at both end faces of the fixed element Ks.

The movable element Ld is, for example, made of a non-magnetic material such as stainless steel. The movable element Ld has a tubular shape with a hollow space. A plurality of cylindrical magnets are stacked in the hollow space of the movable element Ld with the same polarities facing each other. That is, each magnet is stacked with N polarities facing one adjacent magnet and with S polarities facing the other adjacent magnet. For example, a magnetic material such as iron is interposed between the magnets. The movable element Ld is inserted through holes provided in the plurality of arranged coils and is supported so as to be movable in an axial direction by the bearings provided in the fixed element Ks.

The encoder Ec is, for example, an optical type or a magnetic type sensor. The encoder Ec detects a movement quantity (that is, a moving distance) of the movable element Ld of the linear motor Lm and outputs movement quantity information indicating the detected movement quantity to the drive device Dv via a signal line. The adsorption unit Kt is provided at an end of the movable element Ld, that is, at an end portion of the movable element Ld of substrate Bs side, and performs vacuum-adsorption on the work Wk by a vacuum treatment by a vacuum pump (not shown)

The drive device Dv drives the linear motor Lm based on the movement quantity information input from the encoder Ec. As shown in FIG. 1, the drive device Dv includes an electric power converter D1, a current sensor D2, an operation unit D3 and a control unit D4.

The electric power converter D1 converts the electric power supplied from the outside to an electric AC power (an electric driving power) having a predetermined frequency based on the switching signal (an inverter drive signal) input from the control unit D4, and supplies the result to each of the U, V, and W-shape coils of the linear motor Lm. That is, the electric power converter D1 converts the electric power supplied from the outside to the electric AC power having a predetermined frequency (a drive frequency) by driving a plurality of switching elements using the inverter drive signal. The current sensor D2 detects a current value of a drive current supplied to the U and V-shape coils of the linear motor Lm from the electric power converter D1, and outputs the detection result to the control unit D4 as current information.

The operation unit D3 receives each operation instruction and outputs an operation signal corresponding to the operation instruction to the control unit D4. The control unit D4 is configured with an interface circuit and the like that performs transmission and reception of various signals from and to a microcomputer and each unit that is electrically connected to each other. The control unit D4 controls overall operations of the drive device Dv by performing various calculation processing items based on various calculation control programs stored in the microcomputer and performing communications with each unit. Details of the operation of the control unit D4 will be described later.

Next, the operation of the drive device Dv configured as above will be described with reference to FIG. 2(a) to FIG. 9(b).

Figure 2A:
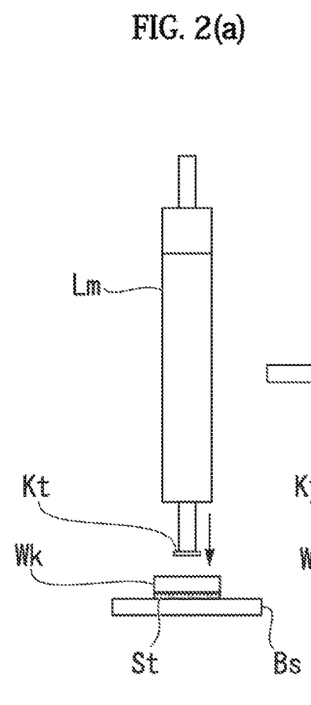
FIG. 2(a) to FIG. 2(c) are schematic diagrams showing an operation of the pressing device in the embodiment of the present invention.
Figure 2B:
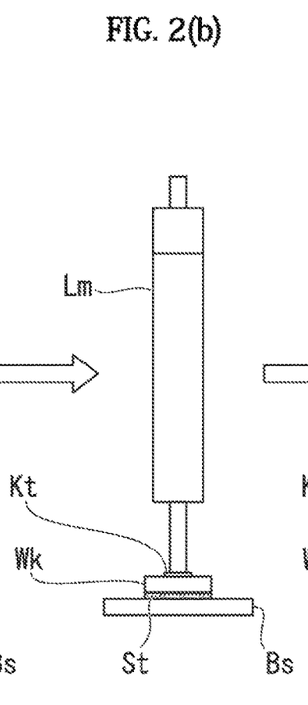

The drive device Dv performs various operations based on the operation instruction input to the operation unit D3. For example, when a position detection instruction is input to the operation unit D3, the drive device Dv starts a position detection operation for detecting and storing a target position described later. Here, as shown in FIG. 2(a), the work Wk is mounted on the substrate Bs via the adhesive St. In addition, the adsorption unit Kt does not perform the vacuum-adsorption and the vacuum treatment by the vacuum pump is also stopped. In addition, the movable element Ld (that is, the adsorption unit Kt) is positioned at an origin position (refer to FIG. 2(a)).

Specifically, when the position detection instruction is input to the operation unit D3, the drive device Dv moves the adsorption unit Kt so as to start to move at a constant speed in the direction of pressing the work Wk, that is, in the downward direction toward the substrate Bs as shown in FIG. 2(a) (STEP S1). That is, in the drive device Dv, when the operation signal corresponding to the position detection instruction is input from the operation unit D3, the control unit D4 causes the electric power converter D1 to generate the drive current for moving the movable element Ld (that is, the adsorption unit Kt) at the constant speed in the downward direction based on the movement quantity information input from the encoder Ec.

At this time, the control unit D4 controls the present speed of the adsorption unit Kt to be the constant speed based on the movement quantity of the movable element Ld (that is, the adsorption unit Kt) represented by the movement quantity information. That is, in a case where the present speed of the adsorption unit Kt is lower than the above described constant speed, the control unit D4 increases the drive current generated by the electric power converter D1. In a case where the present speed of the adsorption unit Kt is higher than the above described constant speed, the control unit D4 decreases the drive current generated by the electric power converter D1.

Figure 3:
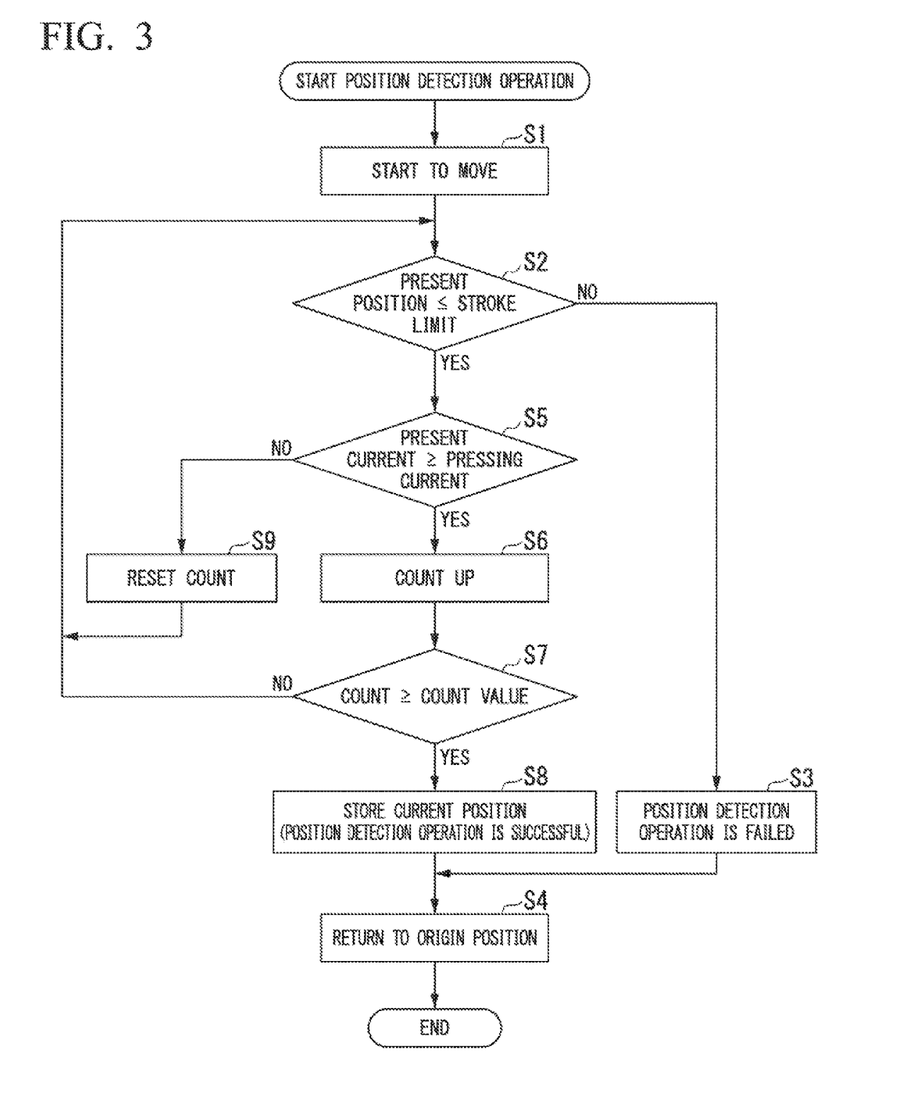
FIG. 3 is a flowchart showing an operation of a drive device in the embodiment of the present invention.

Subsequently, the control unit D4 calculates a present position of the adsorption unit Kt based on the movement quantity information and determines whether or not the present position is equal to or less than a predetermined limit value (hereinafter, referred to as a stroke limit) (STEP S2). The stroke limit described above is a movement limit value of the adsorption unit Kt. The stroke limit may be a set value set by a user.

Figure 2C:
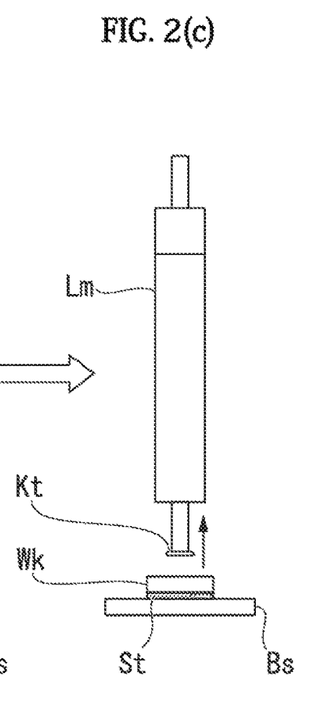

In a case where the present position is not equal to or less than the stroke limit (in a case of NO), the control unit D4 recognizes that the position detection operation has failed (STEP S3). After the completion of STEP S3 described above, the control unit D4 controls the electric power converter D1 to return the adsorption unit Kt to the origin position as shown in FIG. 2(c) (STEP S4).

On the other hand, in a case where the present position of the adsorption unit Kt is not equal to or greater than the stroke limit (that is, less than the stroke limit) (in a case of YES), the control unit D4 calculates the current drive current supplied to the linear motor Lm based on the current information input from the current sensor D2, and determines whether or not the drive current is equal to or greater than a predetermined threshold value (herein after, referred to as a pressing current) (STEP S5). That is, the adsorption unit Kt comes in contact with the work Wk (refer to FIG. 2(b)) and the adsorption unit Kt receives reaction force of the work Wk. Therefore, the drive current increases. Then, the control unit D4 determines whether or not the drive current becomes equal to or greater than the pressing current. The pressing current described above is a control parameter stored in the control unit D4 in advance.

In a case where the current drive current supplied to the linear motor Lm from the electric power converter D1 is equal to or greater than the pressing current (in a case of YES), the control unit D4 starts to count-up a counter prepared therein (STEP S6), and controls the movement of the adsorption unit Kt (the movable element Ld) based on only the current information. Subsequently, the control unit D4 determines whether or not the value of the counter reaches a predetermined count value (STEP S7). In a case where the value of the counter does not reach the predetermined count value (that is, less than the predetermined count value) (in a case of NO), the control unit D4 returns the processing to STEP S2.

On the other hand, when the value of the counter reaches the predetermined count value (in a case of YES), the control unit D4 stores the present position as a target position, and recognizes that the position detection operation is successful (STEP S8). The control unit D4 repeatedly performs the processing items in STEP S2, S5, S6, and S7 at a predetermined period. That is, the case where the value of the counter reaches the predetermined count value in the processing in STEP S7 described above means a situation in which a predetermined time corresponding to the count value has elapsed since the current drive current becomes equal to or greater than the pressing current in the processing in STEP S5. Therefore, in a case where the predetermined time has elapsed since the current drive current becomes equal to or greater than the pressing current, that is, in a case where the processing result in STEP S7 is "YES", the control unit D4 performs the processing in STEP S8.

The target position described above is used in a pressing operation described later, and is a value indicating an destination position to which the adsorption unit Kt is to reach when the work Wk is pressed to the substrate Bs, that is, a value indicating a position of the adsorption unit Kt when the work Wk adsorbed to the adsorption unit Kt comes in contact with the substrate Bs in the pressing operation. In addition, in a case where the current drive current is not equal to or greater than the pressing current in the processing in STEP S5 (that is, less than the pressing current) (in a case of NO), the control unit D4 resets the counter described above (STEP S9).

After the completion of STEP S3 and STEP S8 described above, the control unit D4 controls the electric power converter D1 and returns the adsorption unit Kt to the origin position as shown in FIG. 2(c) (STEP S4). The drive device Dv performs the processing items in STEPs S1 to S9 and completes the position detection operation. In the present embodiment, only by inputting the position detection instruction to the operation unit D3 by the user, the position detection operation is performed automatically and the target position is detected and stored. Therefore, it is not necessary for the user himself/herself to detect the target position by a manual operation or the like, and thus, efforts of the user can be reduced.

Figures 6A, 6B:
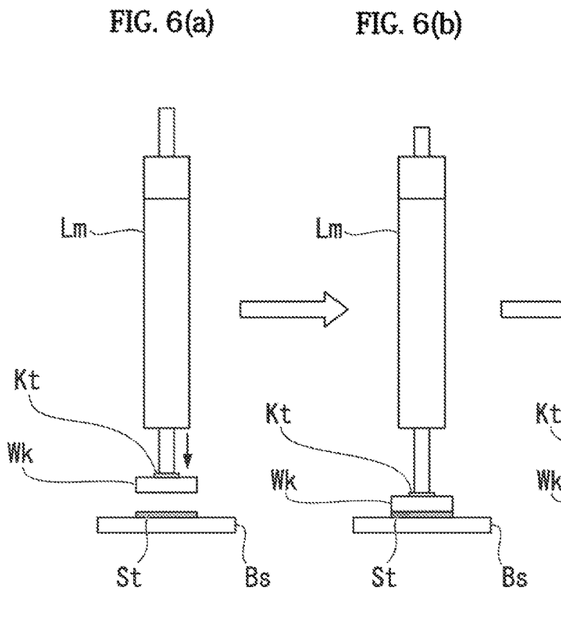
FIG. 6(a) to FIG. 6(c) are schematic diagrams showing the operation of the pressing device in the embodiment of the present invention.

On the other hand, when a pressing instruction is input to the operation unit D3, the drive device Dv starts the pressing operation for causing the linear motor Lm to press the work Wk on the substrate Bs. Here, the movable element Ld (that is, the adsorption unit Kt) is positioned at the origin position as shown in FIG. 6(a). In addition, the adsorption unit Kt is in a state in which the work Wk is vacuum-adsorbed. That is, the work Wk is in a state of being lifted by the adsorption unit Kt. In addition, the adhesive St for bonding the work Wk is applied at a predetermined position on the substrate Bs as shown in FIG. 6(a).

Figure 4:
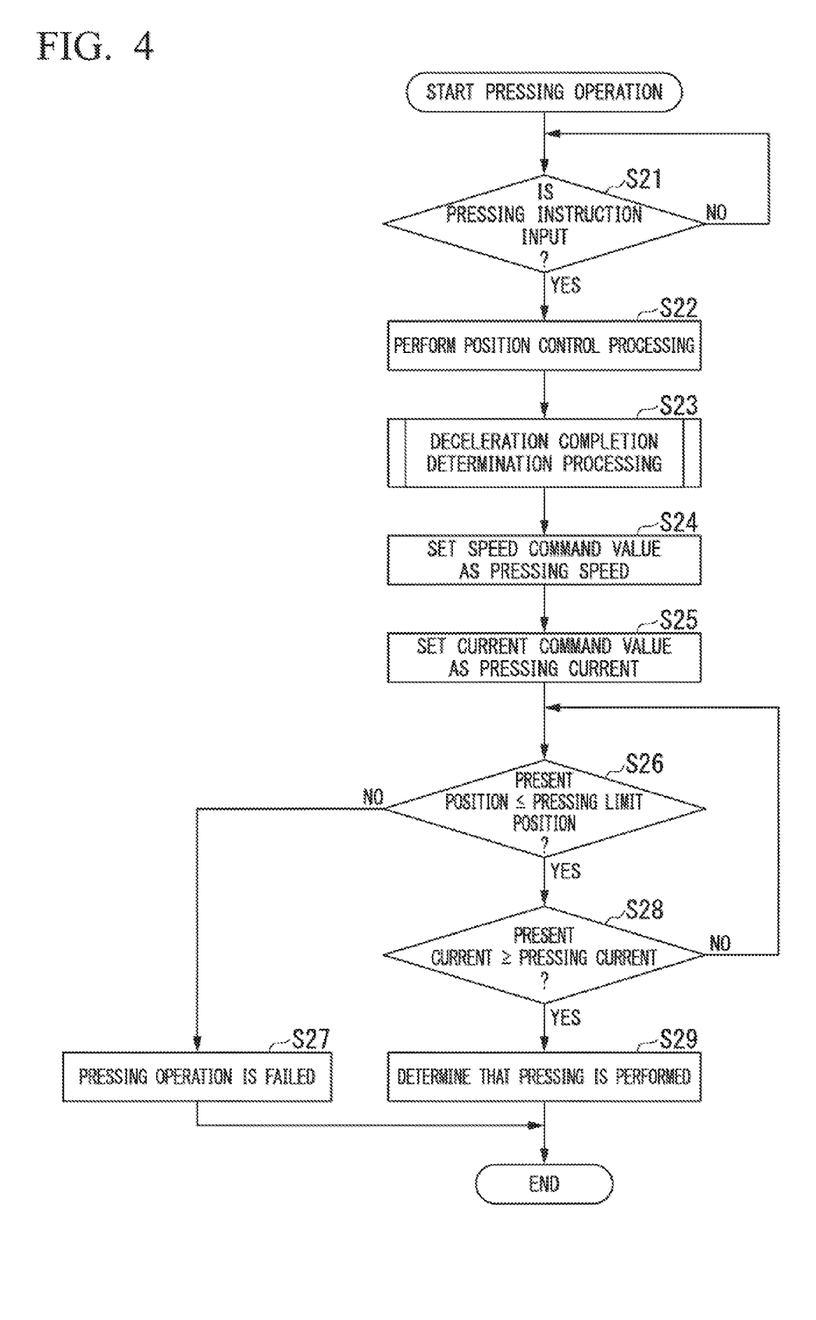
FIG. 4 is a flowchart showing the operation of the drive device in the embodiment of the present invention.

First, in the drive device Dv, the control unit D4 determines whether or not the operation signal corresponding to the pressing instruction is input from the operation unit D3 (STEP S21). In a case where the operation signal corresponding to the pressing instruction is not input (in a case of NO), the process returns to STEP S21. On the other hand, in a case where the operation signal corresponding to the pressing instruction is input (in a case of YES), the control unit D4 moves the adsorption unit Kt so as to start to move in the direction of pressing the work Wk to the substrate Bs, that is, in the downward direction toward the substrate Bs as shown in FIG. 6(a), and performs position control processing (STEP S22). The position control processing is processing for moving the adsorption unit Kt toward the above-described target position while changing the speed of the adsorption unit Kt based on the movement quantity information and current information.

Figure 7:
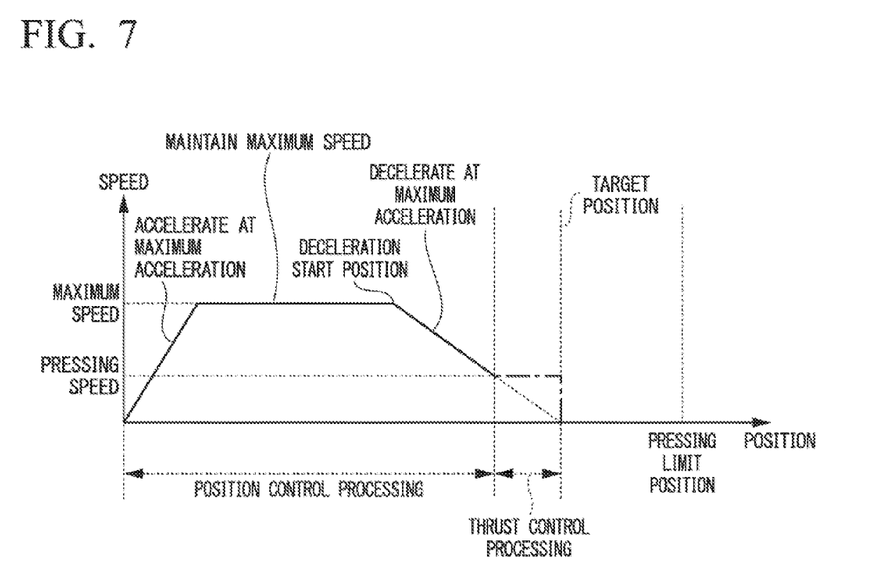
FIG. 7 is a timing chart showing the operation of the drive device in the embodiment of the present invention.

Specifically, in the position control processing described above, when the adsorption unit Kt starts to move, the control unit D4 accelerates the adsorption unit Kt at maximum acceleration up to a maximum speed (refer to FIG. 7). The maximum acceleration means acceleration generated in a case where a maximum current is supplied to the linear motor Lm as the drive current. In addition, the maximum speed described above is also determined according to the maximum current. In addition, the maximum current is determined based on the specifications of the linear motor Lm or the drive device Dv. The control unit D4 stores the above-described maximum current in advance, causes the electric power converter D1 to generate the maximum current as the drive current, and accelerates the adsorption unit Kt at the maximum acceleration.

Subsequently, in the position control processing, the control unit D4 maintains the adsorption unit Kt at the maximum speed when the speed of the adsorption unit Kt reaches the maximum speed (refer to FIG. 7). That is, the control unit D4 stores the maximum speed in advance, and calculates the present speed of the adsorption unit Kt based on the movement quantity information. When the present speed reaches the maximum speed, the control unit D4 maintains the adsorption unit Kt at the maximum speed.

Furthermore, in the position control processing, after maintaining the adsorption unit Kt at the maximum speed, when the adsorption unit Kt reaches the deceleration start position at which the speed of the adsorption unit Kt becomes zero at the target position described above in a case of decelerating at maximum deceleration, the control unit D4 starts to decelerate the adsorption unit Kt at the maximum deceleration (refer to FIG. 7). The maximum deceleration described above is determined based on the specifications of the linear motor Lm or the drive device Dv. In addition, the deceleration start position described above is determined based on the target position and maximum deceleration described above. The control unit D4 calculates the deceleration start position in advance based on the target position and maximum deceleration, and stores the deceleration start position.

In addition, the control unit D4 performs deceleration completion determination processing simultaneously with the position control processing (STEP S23). The deceleration completion determination processing is processing for determining whether the deceleration of the adsorption unit Kt at the maximum deceleration is completed or not.

Figure 5:
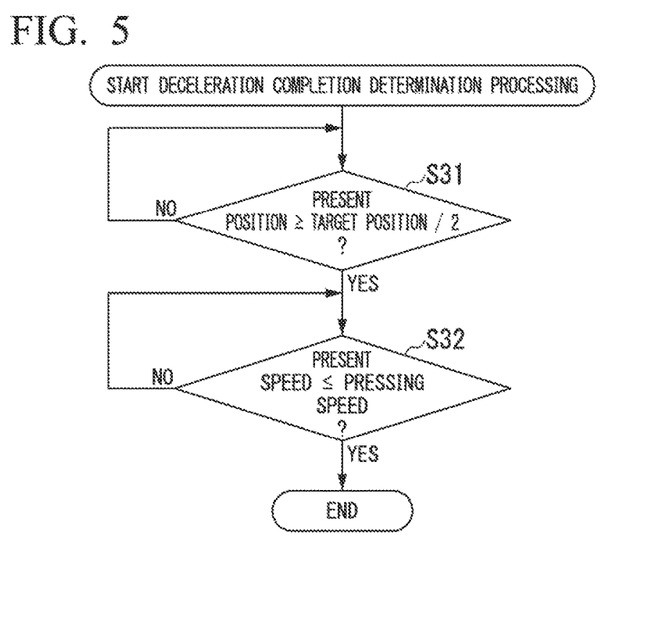
FIG. 5 is a flowchart showing the operation of the drive device in the embodiment of the present invention.

Specifically, in the deceleration completion determination processing described above, the control unit D4 calculates the present position of the adsorption unit Kt based on the movement quantity information and determines whether or not the present position is equal to or greater than "target position/2" (STEP S31). In a case where the present position of the adsorption unit Kt is not equal to or greater than "target position/2" (that is, less than "target position/2") (in a case of NO), the control unit D4 returns the process to the processing in STEP S31. On the other hand, in a case where the present position of the adsorption unit Kt is equal to or greater than "target position/2" (in a case of YES), the control unit D4 calculates the present speed of the adsorption unit Kt based on the movement quantity information and determines whether or not the present speed is equal to or lower than a predetermined lower limit speed (hereinafter, referred to as a pressing speed) (STEP S32). That is, the control unit D4 determines whether or not the speed of the adsorption unit Kt is decelerated down to the pressing speed.

The control unit D4 determines the deceleration completion by repeatedly performing the deceleration completion determination processing described above, that, is the processing items in STEPs S31 and S32 simultaneously with the position control processing. The reason why the processing in STEP S31 is provided is because there is a possibility that it may be erroneously determined that the deceleration is completed in a case where the deceleration completion determination processing includes only the processing in STEP S32. That is, in a case where the deceleration completion determination processing includes only the processing in STEP S32, when adsorption unit Kt is accelerated at the maximum acceleration during the performance of the position control processing, it is determined that the deceleration is completed even in a case where the present speed of the adsorption unit Kt is equal to or lower than the pressing speed. In order to prevent this erroneous determination, by providing the processing in STEP S31, it is determined that the present speed is equal to or lower than the predetermined lower limit speed in the processing in STEP S32 at the time of deceleration, not at the time of acceleration.

In a case where the present speed of the adsorption unit Kt is not equal to or lower than the pressing speed (that is, exceeds the pressing speed) (in a case of NO), the control unit D4 returns the process to the processing in STEP S32. On the other hand, in a case where the present speed of the adsorption unit Kt is equal to or lower than the pressing speed (in a case of YES), the control unit D4 performs thrust control processing instead of the position control processing. The thrust control processing is processing for stabilizing a moving speed of the adsorption unit Kt based on the current information and moving the adsorption unit Kt toward the target position. At this time, in order to stabilize the present speed of the adsorption unit Kt, the control unit D4 stabilizes the drive current generated by the electric power converter D1 based on the current information.

The control unit D4 sets a speed command value as the pressing speed (STEP S24), and sets a current command as the pressing current based on the speed command value (STEP S25). The control unit D4 controls the speed of the adsorption unit Kt to be constant based on the current information. The control unit D4 calculates the present position of the adsorption unit Kt based on the movement quantity information and determines whether or not the present position is equal to or less than a predetermined pressing limit position (STEP S26). The pressing limit position described above is a mechanical stroke end (for example, a position of the substrate Bs under the work Wk), or may be a set value set by the user.

In a case where the present position is not equal to or less than the pressing limit position (in a case of NO), that is, in a case where the present position exceeds the pressing limit position, the control unit D4 recognizes that the present position exceeds the pressing limit position, and thus, recognizes that the pressing operation has failed (STEP S27). On the other hand, in a case where the present position is equal to or less than the pressing limit position (in a case of YES), the control unit D4 determines whether or not the current drive current is equal to or greater than the above-described pressing current based on the current information while the adsorption unit Kt moves at the constant speed (STEP S28). That is, the work Wk adsorbed to the adsorption unit Kt comes in contact with the substrate Bs via the adhesive St (refer to FIG. 6(b)) and the adsorption unit Kt receives the reaction force of the work Wk. Therefore, the drive current increases. Then, the control unit D4 determines whether or not the drive current becomes equal to or greater than the pressing current.

In a case where the current drive current is not equal to or greater than the pressing current (that is, less than the pressing current) (in a case of NO), the control unit D4 returns the process to the processing in STEP S26. On the other hand, in a case where the current drive current supplied to the linear motor Lm is equal to or greater than the pressing current (in a case of YES), the control unit D4 determines that the adsorption unit Kt performs pressing (determines that the pressing operation is performed) (STEP S29). The case where the current drive current supplied to the linear motor Lm is equal to or greater than the pressing current is a situation in which the adsorption unit Kt reaches the target position. In addition, in the thrust control processing described above, the control unit D4 moves the adsorption unit Kt toward the target position. However, when the current drive current supplied to the linear motor Lm becomes equal to or greater than the pressing current, the movement of the adsorption unit Kt is stopped as described above.

Figure 6C:
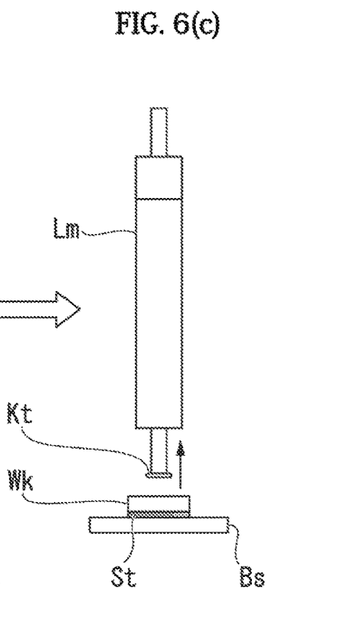

Here, the adsorption unit Kt stops the vacuum processing by the vacuum pump (not shown) and releases the vacuum-adsorption. After the processing in STEP S26, the control unit D4 controls the electric power converter D1 and returns the adsorption unit Kt to the origin position as shown in FIG. 6(c). The drive device Dv performs the processing items in STEPs S21 to S29, and completes the pressing operation.

In the present embodiment, when the speed of the adsorption unit Kt is decelerated down to the pressing speed, the speed of the adsorption unit Kt is controlled to be constant using the thrust control processing, and when the drive current reaches the predetermined current value, it is determined that the pressing operation is performed. Therefore, in the present embodiment, it is possible to suppress the impact force by the adsorption unit Kt on the work Wk or the substrate Bs without the possibility that the adsorption unit Kt cannot be sufficiently decelerated as in the related art described above.

Figure 8:
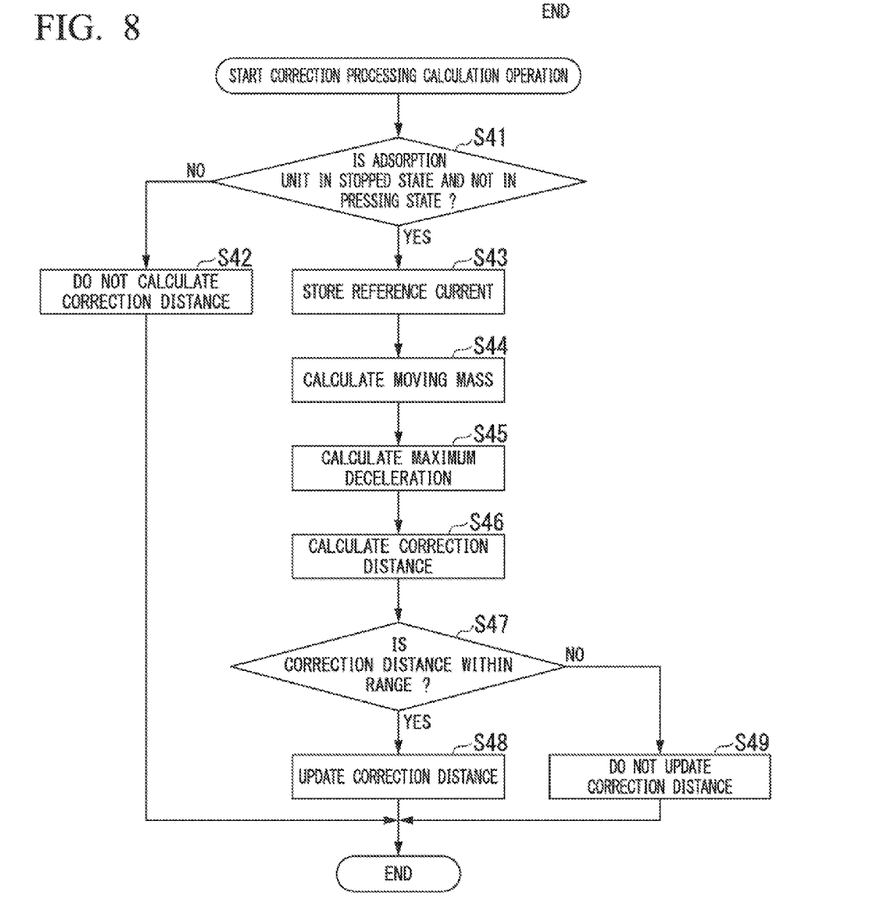
FIG. 8 is a flowchart showing the operation of the drive device in the embodiment of the present invention.

Furthermore, as a modification example of the pressing operation, the drive device Dv performs a correction distance calculation operation for calculating a correction distance for reducing a time for the adsorption unit Kt to reach the target position from the time when the speed becomes the pressing speed, that is, a thrust control processing time. The correction distance calculation operation described above can be performed at any time as long as the time is between the time of turning-ON of the power source of the linear motor Lm and the time of starting the pressing operation. For example, the correction distance calculation operation may be performed during the performance of the position detection operation described above. Specifically, the correction distance calculation operation may be performed immediately before the processing in STEP S4, that is, immediately before the adsorption unit Kt is returned to the origin position.

First, in the drive device Dv, the control unit D4 determines whether or not the adsorption unit Kt is in the stopped state and is not in the pressing state (STEP S41). In a case of NO, that is, in a case where the adsorption unit Kt is not in the stopped state or in the pressing state, the control unit D4 ends the processing without performing the calculation of the correction distance (STEP S42).

In a case of YES, that is, in a case where the adsorption unit Kt is in the stopped state and is not in the pressing state, the control unit D4 calculates the current drive current supplied to the linear motor Lm based on the current information, and stores the drive current as a reference current (STEP S43). At this time, the control unit D4 stores a time average of the drive current obtained from the current information as the reference current.

Subsequently, the control unit D4 substitutes the stored reference current into the following equation (1), and calculates a moving mass including a mass of the movable element Ld and adsorption unit Kt (STEP S44). In a case where the work Wk is adsorbed to the adsorption unit Kt, the mass of the work Wk is included in the moving mass described above, and in a case where the work Wk is not adsorbed to the adsorption unit Kt, the mass of the work Wk is not included in the moving mass. That is, in a case where the work Wk is adsorbed to the adsorption unit Kt, the moving mass is the mass of the movable element Ld, adsorption unit Kt and work Wk, and in a case where the work Wk is adsorbed to the adsorption unit Kt, the moving mass is the mass of the movable element Ld and adsorption unit Kt.

mass [kg]=reference current [Arms]×motor constant [N/Arms]/gravitational acceleration [m/sec^2]   (1)

Subsequently, the control unit D4 substitutes the above-described mass into the following equation (2) and calculates the maximum deceleration (STEP S45).

maximum deceleration [m/sec^2]=maximum thrust [N]/mass [kg]−gravitational acceleration [m/sec^2]   (2)

Subsequently, the control unit D4 calculates a deceleration time required for the speed of adsorption unit Kt is decelerated at the maximum deceleration down to zero from the pressing speed by substituting the maximum deceleration into the following equation (3).

deceleration time [sec]=pressing speed [m/sec]/maximum deceleration [m/sec^2]   (3)

Subsequently, the control unit D4 performs a calculation according to the following equation (4), that is, calculates the correction distance obtained by multiplying a value obtained by multiplying the maximum deceleration by the square of deceleration time, by a predetermined adjustment value (STEP S46). The predetermined adjustment value described above is, for example, "0.5".

correction distance [mm]=adjustment value×maximum deceleration [m/sec^2]×deceleration time [sec]^2×1000   (4)

Figure 9A:
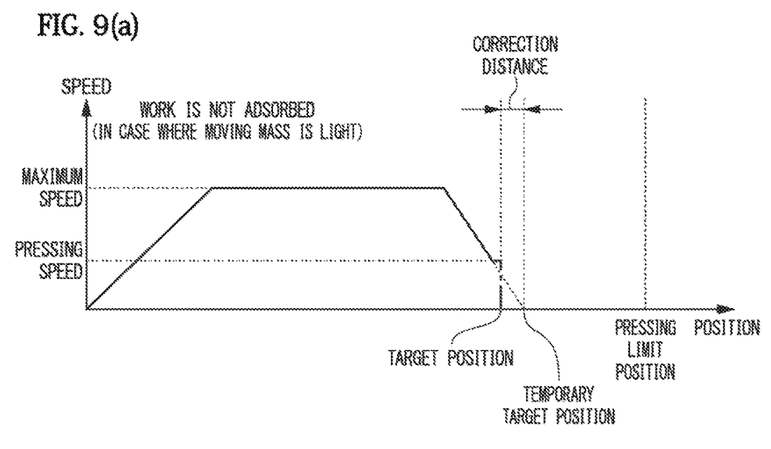
FIG. 9(a) and FIG. 9(b) are timing charts showing a correction distance in the drive device in the embodiment of the present invention.
Figure 9B:
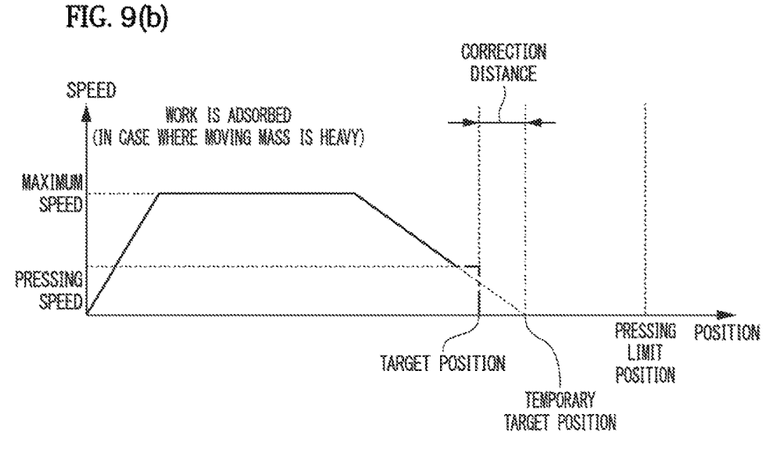

The control unit D4 determines whether or not the calculated correction distance is within a predetermined range (STEP S47). That is, the control unit D4 determines whether or not the correction distance is abnormal value that is outside the predetermined range. In a case where the correction distance is within the predetermined range (in a case of YES), the control unit D4 updates the previously calculated and stored correction distance with die newly calculated correction distance (STEP S48). On the other hand, in a case where the correction distance is not within the predetermined range (in a case of NO), the control unit D4 does not update the correction distance (STEP S49). As shown in FIG. 9(a) and FIG. 9(b), the above-described correction distances in a case where the adsorption unit Kt does not adsorb the work Wk and in a case where the adsorption unit Kt adsorbs the work Wk are significantly different from each other. That is, in a case where the moving mass is light, the correction distance decreases, and in a case where the moving mass is heavy, the correction distance increases.

The control unit D4 calculates a temporary target position by adding the correction distance to the target position described above. Then, the control unit D4 calculates the deceleration start position based on the temporary target position instead of the target position. When the pressing instruction is input and when the adsorption unit Kt reaches the deceleration start position in the position control processing described above (processing in STEP S22), the control unit D4 causes the adsorption unit Kt to start the deceleration at the maximum deceleration (refer to FIG. 9(a) and FIG. 9(b)). In the present embodiment, since the thrust control processing time can be reduced by using the correction distance, it is possible to further reduce the tact time. In the pressing device A, as the moving mass increases, the deceleration decreases. Therefore, if the same correction distance is provided regardless of the weight of the work Wk, in a case where the work Wk is heavy, the time to reach the target position increases, and thus, it takes an unnecessary time. Therefore, if a long correction distance is taken after the target position, the predetermined deceleration can be obtained in the vicinity of the target position, and thus, the unnecessary time can be avoided when the processing is switched to the thrust control processing.

In addition, in a case where the work Wk is light, the deceleration does not decrease compared to the case where the work Wk is heavy. Therefore, there is no need to take a long correction distance, and thus, the unnecessary time can be avoided even if the correction distance is short.

According to the present embodiment, when the speed of the adsorption unit Kt is decelerated down to the pressing speed, the adsorption unit Kt is maintained at the pressing speed, and is stopped when the adsorption unit Kt reaches the target position. Therefore, as in the related art described above, it is possible to suppress the impact force by the adsorption unit Kt mounted on the movable element Ld on the work Wk or the substrate Bs without the possibility that the adsorption unit Kt cannot be sufficiently decelerated.

In addition, in the present embodiment, it is possible to reduce the tact time by accelerating the adsorption unit Kt at the maximum acceleration up to the maximum speed when the adsorption unit Kt starts to move, and maintaining the maximum speed up to the deceleration start position described above when the speed of the adsorption unit Kt reaches the maximum speed. In addition, in the present embodiment, the pressing operation can automatically be performed only by inputting the pressing instruction to the operation unit D3 by the user. Therefore, it is possible to reduce the user's efforts such as inputting various parameters.

In addition, in the present embodiment, the position detection operation can be performed automatically and the target position is detected only by inputting the position detection instruction to the operation unit D3 by the user. Therefore, the user does not need to manually detect and store the target position by himself/herself, and thus, it is possible to reduce the user's efforts. In addition, in the present embodiment, the thrust control processing time can be reduced by using the correction distance. Therefore, it is possible to reduce the tact time.

In addition, in the present embodiment, the linear motor Lm is provided as an actuator, and the linear motor Lm causes the adsorption unit Kt to move linearly. Therefore, the work Wk adsorbed to the adsorption unit Kt can be pressed to the substrate B. In addition, in the present embodiment, the adsorption unit Kt adsorbs, that is, grips the work Wk that is the predetermined electronic component, and the work W as a mounted object is pressed and mounted to the substrate Bs which is a mounting target object and the pressed object. Therefore, it is possible to reduce the human efforts when mounting the work Wk to the substrate Bs.

The present invention is not limited by each of the embodiments described above, and for example, following modification examples may be conceivable.

(1) In each embodiment described above, the deceleration start position is automatically calculated. However, in the related art, the user has manually input the deceleration start position. The user may select to use the operation among the pressing operation in the related art and the new pressing operation described above (processing items in STEPs S21 to S27).

(2) In each embodiment described above, the description is made with the case where the present invention is applied to the device including the linear motor Lm. However, the present invention is not limited thereto. The present invention can be applied to a device including a rotating motor other the linear motor Lm.

(3) In the embodiment described above, in the pressing operation, the work Wk adsorbed to the adsorption unit Kt is pressed toward the substrate Bs. However, the present invention is not limited thereto. The present invention can be applied to a device in which the work Wk disposed on the substrate Bs via the adhesive St is pressed by the pressing unit that does not have the adsorption function and the work Wk is pressed to the substrate Bs.

(4) In the embodiment described above, the temporary target position is calculated by calculating the correction distance through the correction distance calculation operation described above and adding the correction distance to the target position. However, the present invention is not limited thereto. For example, in the present invention, the temporary target position may be calculated by adding the correction distance input by the user to the target position, or the temporary target position may be calculated by calculating the correction distance using another equation other than equations (1) to (4) described above, and adding the correction distance to the target position.

(5) In the embodiment described above, in the deceleration completion determination processing in STEP S31, it is determined whether or not the adsorption unit Kt is decelerated with "target position/2" as a reference. However, the present invention is not limited thereto. For example, by calculating the speed of the adsorption unit Kt using the encoder Ec, and by checking the calculated change amount of an average speed of the adsorption unit Kt, if the average speed decreases, it may be determined that the adsorption unit Kt is decelerated. In addition, for example, the deceleration of the adsorption unit Kt may be determined using an acceleration sensor, or the deceleration of the adsorption unit Kt may be determined using a flowing direction of the drive current.

INDUSTRIAL APPLICABILITY

According to a pressing device described above, it is possible to reduce a tact time and suppress the impact force to the pressed unit by the pressing unit.

BRIEF DESCRIPTION OF THE REFERENCE SYMBOLS

A: pressing device
Lm: linear motor (actuator)
Ec: encoder (movement quantity detector)
Kt: adsorption unit (pressing unit)
Dv: drive device
Wk: work
Bs: substrate (pressed object)

St: adhesive
D1: electric power converter
D2: current sensor
D3: operation unit
D4: control unit

The invention claimed is:

1. A pressing device comprising:

an actuator;

a pressing unit provided on a movable element of the actuator;

a movement quantity detector for detecting a movement quantity of the movable element and outputting movement quantity information indicating the movement quantity to a drive device; and the drive device moves the pressing unit to press a predetermined electronic component adsorbed to the pressing unit toward a pressed object by supplying a drive current to the actuator based on the movement quantity information input from the movement quantity detector, wherein:

the pressing unit has a vacuum-gripping unit for performing vacuum-gripping of the predetermined electronic component, and presses and mounts the predetermined electronic component as a mounted object to a printed substrate which is a mounting target object of the pressed object, the drive device includes an electric power converter, a current sensor, an operation unit and a control unit, the current sensor is configured to detect a current value of the drive current supplied to the actuator from the electric power converter and to output a detection result to the control unit, the control unit is configured to:
  store a position where the pressing unit is in contact with the pressed object as a target position in advance,
  accelerate the pressing unit up to a maximum speed at a maximum acceleration using position control processing based on current information indicating the drive current and the movement quantity information when the pressing unit starts to move,
  maintain the maximum speed when the speed of the pressing unit reaches the maximum speed,
  decelerate the pressing unit at a maximum deceleration when the pressing unit reaches a deceleration start position where the speed of the pressing unit becomes zero at the target position in a case where the pressing unit is decelerated at the maximum deceleration,
  switch the processing from the position control processing to thrust control processing based on the current information when the speed of the pressing unit is decelerated down to a predetermined lower limit speed, and
  control the speed of the pressing unit to be constant based on the current information, and when the current reaches a predetermined current value, determine that the pressing operation is performed, the control unit is configured to calculate a position of the movable element based on the movement quantity information at a time point when the drive current supplied to the actuator based on the current information input from the current sensor becomes equal to or greater than a predetermined threshold value when moving the pressing unit toward the pressed object at a constant speed, and to store the position as the target position, the control unit is configured to perform a deceleration completion determination processing that determines whether a deceleration of the pressing unit at the maximum deceleration is completed or not simultaneously with the position control processing, in the deceleration completion determination processing, the control unit is configured to calculate a present position of the pressing unit based on the movement quantity information and perform a first process of determining whether or not the present position is equal to or greater than a stroke length of the movable element to the target position/2, in a case where the present position of the pressing unit is not equal to or greater than the stroke length of the movable element to the target position/2, the control unit is configured to repeat the first process, in a case where the present position of the pressing unit is equal to or greater than the stroke length of the movable element to the target position/2, the control unit is configured to calculate a present speed of the pressing unit based on the movement quantity information and perform a second process of determining whether or not the present speed is equal to or lower than the predetermined lower limit speed, and the control unit is configured to store a time average of the drive current obtained from the current information as a reference current when the pressing unit stops, calculate a moving mass including a mass of the movable element, the predetermined electronic component, and the pressing unit based on the reference current, calculate the maximum deceleration based on the moving mass, calculate a deceleration time required for the speed to be decelerated at the maximum deceleration down to zero from the lower limit speed based on the maximum deceleration, calculate a temporary target position by adding the target position to a correction distance obtained from the maximum deceleration and the deceleration time, and calculate the deceleration start position based on the temporary target position.

2. The pressing device according to claim 1, wherein the control unit is configured to calculate the temporary target position by adding a predetermined distance to the target position, and to calculate the deceleration start position based on the temporary target position.

3. The pressing device according to claim 1, wherein the actuator is a linear motor.

* * * * *